United States Patent [19]

Tabarelli et al.

[11] Patent Number: 4,621,922
[45] Date of Patent: Nov. 11, 1986

[54] DEVICE FOR THE PROJECTION COPYING OF MASKS ONTO A WORKPIECE

[75] Inventors: Werner Tabarelli, Vaduz; Ernst Löbach, Eschen, both of Liechtenstein

[73] Assignee: Perkin-Elmer Censor Anstalt, Vaduz, Liechtenstein

[21] Appl. No.: 640,085

[22] Filed: Aug. 10, 1984

[51] Int. Cl.⁴ .............................................. G03B 27/52
[52] U.S. Cl. ........................................ 355/41; 350/442
[58] Field of Search ................. 355/41, 43, 45, 53, 355/67, 70; 356/400, 401; 350/442

[56] References Cited

U.S. PATENT DOCUMENTS

| 4,215,935 | 8/1980 | Loebach | 355/67 |
| 4,405,229 | 9/1983 | Mayer | 355/53 X |
| 4,437,758 | 3/1984 | Suzuki | 355/41 |

Primary Examiner—Michael L. Gellner
Assistant Examiner—Brian W. Brown
Attorney, Agent, or Firm—Pahl, Lorusso & Loud

[57] ABSTRACT

To adjust a device for the projection copying of masks on a semiconductor substrate, adjustment marks are illuminated with wideband adjustment light in order to make variations in the intensity of the reflected signal in the area of a mark field. The color defect created by the wideband nature of the adjustment light is eliminated by an achromatization device which covers only a part of the total picture field which contains the adjustment marks.

16 Claims, 8 Drawing Figures

DEVICE FOR THE PROJECTION COPYING OF MASKS ONTO A WORKPIECE

BACKGROUND OF THE INVENTION

The invention pertains to a device for projection-copying of a mask onto a workpiece, in particular a semiconductor substrate for the production of integrated circuits, in which case the pattern of the mask is projected via a projection lens onto a photosensitive layer of the workpiece in order to align the mask and workpiece relative to one another after alignment patterns of the mask and adjustment areas on the workpiece have been projected onto each other by means of an adjustment light with a bandwidth of at least 3 nm through the projection lens and with the aid of an auxiliary optical system which receives only adjustment light coming from a sub-area of the workpiece which comprises at least one adjustment area.

Projection lenses for the lithographic production of integrated circuits are characterized by a large picture field with a diameter which typically lies between 10 and 30 nm and a large numerical aperture when there is a great resolution capability which is limited with respect to diffraction. Because of the necessity of projecting different pictures one on top of the other in such a way that they precisely cover one another, the distortion in the entire field must not exceed 0.2 $\mu$m and the picture field must be completely level, i.e., any convexity must not exceed 0.3 $\mu$m.

At the present state of the art, lenses which meet such stringent requirements can be corrected up to the diffraction limit only for a very narrow wavelength range, which is to be understood as a bandwidth of a few nm. This narrow correction area is selected in such a way that within it the sensitivity of the photosensitive resist is as high as possible and, on the other hand, an appropriate source of illumination is available. Typical correction ranges are 406 nm±4 nm or 436 nm±4 nm, corresponding to the most intense spectral lines of mercury discharge lamps.

As mentioned above, it is vital for the projection of the pattern of the mask to take place not only with good picture quality, but also with complete precision of positioning. The precision with respect to the lateral coordinates (X, Y, $\theta$) is necessary in this case in order for the successive patterns to be correctly allocated, but in addition it is also necessary to precisely focus an entire picture plane since the depth of focus of the above-described lenses is very slight.

The alignment of the mask and workpiece is preferably carried out through the lens itself, and in this process the adjustment areas for lateral adjustment are defined by marks of the most widely varying structure. Per se, the unaltered reflective surface of the workpiece itself is sufficient for focusing.

Focusing as such does not necessarily require that the workpiece be observed through the lens. For instance, it is a known process to determine the distance between the lens and the workpiece by means of capacitive sensors with the aid of the flow resistance which the annular gap between the lens and the workpiece presents to a discharging gas, or from the eigen-frequency of an air resonance section between the workpiece and the lens. A prerequisite in this case, however, is that there be a very short distance between the lens and the workpiece, but such a short distance is precisely what is avoided through the use of projection illumination procedures, in contrast to the obsolete contact procedures. When optical focusing is carried out without the use of the projection lens, a tightly packed beam of light is obliquely directed onto the center of the field to be illuminated and the point where the reflected light beam strikes is observed; the location of this point is a measure of the location of the illumination field itself. The light used is frequently laser light (a HeNe laser). A disadvantage in this case is the fact that it is impossible to distinguish whether the change in the position of the light point on the receiver is caused by a change in the angle of incidence or the Z position. In practice, it is assumed that the angle of incidence is constant, i.e., that the reflective wafer surface is always vertical to the optical axis. This condition is never rigorously met; sometimes there are even large deviations from the ideal position. When the laser light is used, another problem arises due to diffraction effects at the wafer surface (speckle), in particular if the surface has already been structured (higher manufacturing stages).

Since, when adjustment is done through the projection lens, the system-related disadvantages of the above-described procedures do not arise, there is great interest in solving the sub-problems which still exist with this type of adjustment. When adjustment is done through the projection lens, problems arise when the adjustment light is not identical to the illumination light for which the projection lens is corrected. Initially we think here of the case where the wavelength range of the adjustment light lies outside of the range of the spectral sensitivity of the photosensitive resist to avoid having the marks on the workpiece be destroyed by the adjustment process. The difference with respect to focal length and magnification which the lens shows depending on the type of light used can be compensated for by bending the adjustment beam through a pair of mirrors or by lengthening the beam by means of intermediate glasses or by shifting the location of the protector for adjustment. Since tests can readily determine the extent to which the focal length and magnification of the lens differ at the corresponding illumination wavelength and adjustment wavelength, overall the consequences of this difference can be easily handled: with respect to the position where the device is optimally aligned with the adjustment light, prior to illumination being carried out a shift is simply made which takes the differing behavior of the lens in the two cases into account.

Since, with an illumination wavelength which deviates from the adjustment wavelength, the picture defects of the lens can be corrected only when the bandwidth of the adjustment light is relatively small, it is assumed that the adjustment light used should, in principle, be narrowband. The frequently-made suggestion that laser light be used for adjustment purposes has not proven out in practice since, due to the coherence of this light, diffraction effects (speckle) occur which distort the measurement results. Generally mercury discharge lamp light, the natural line width of which is approximately 3 nm, is thus used for adjustment.

Surprisingly enough, it has been found that, when the adjustment is carried out with mercury light through the projection lens in the way described in the introduction, a nonsystematic error arises, the cause of which was found to be the fact that the reflection capacity of the workpiece is dependent on the processing stage of the workpiece and, in addition, that this capacity varies on the surface of the workpiece. Not only does the color of the reflected adjustment light deviate slightly from the color of the input adjustment light, but differences in the color of the reflected adjustment light appear from workpiece to workpiece and from mark to mark on the same workpiece. If it is assumed that, in addition to the spectral line itself, the adjacent area of the radiation background in a total width of, for example, 10 nm is also typically passed by the narrowband interference filter in front of the adjustment light sources, it is still amazing that the differences of 1–2 nm which arise overall in the wavelength of the reflected adjustment light still have an effect on the precision of the adjustment. Due to the heavy frequency dependency of the lens used, on the one hand, and the extreme demands imposed on adjustment precision, on the other, however, this is indeed the case.

The invention thus is based on the recognition that it is not sufficient, as was previously the assumption, to take into account the differences which arise, regarding the focal length and magnification of the lens, in the illumination wavelength on the one hand and, on the other, an adjustment wavelength which is assumed to be constant, but rather it is necessary to eliminate the effect of the difference in the reflection behavior of the workpieces, which difference cannot be known in advance, and which leads to a change in the spectral composition of the input adjustment light.

SUMMARY OF THE INVENTION

For this purpose the invention has the feature that the auxiliary lens system comprises a device for correcting chromatic aberration caused by this bandwidth.

The present state of the art includes devices for correcting chromatic aberration. For example, it is possible to ensure that the device for correcting chromatic aberration consists of a combination of a concave lens and a concave mirror. Since wideband achromatization of the projection lens over the entire picture field is impossible, the invention calls for placing achromatization devices which are known per se only in the path of the beam of adjustment light.

If the adjustment area is in a central location, then of the two known color defects, namely longitudinal color defect and color magnification defect, only the latter is of importance, and only it needs to be corrected. In the case of adjustment areas which lie outside of the optical axis, it is also necessary to eliminate the color magnification defect.

Since the invention makes it possible to make complete allowance for the effect of the frequency dependency of the projection lens, it is now possible to increase the bandwidth of the adjustment light to the full extent allowed by the remaining picture defects of the projection lens. A certain amount of assistance is provided in this regard by the method, described in West German Pat. No. 29 00 921, of leaving uncorrected picture defects which convert points into lines running sagitally or meridionally to the optical axis and reducing their effect by appropriately orienting the adjustment marks.

The advantage of using as wide an adjustment light as possible lies in the fact that it makes it possible to eliminate adjustment errors which are caused by the fact that, in the area of an individual mark, interference phenomena give rise to changes in the intensity of the reflected light which lead to misinterpretations of the reflected mark picture. With very narrowband light, such changes in intensity occur even when the surface of the workpiece is almost ideal. Deviations in the resist surface from the ideal level shape and the structure of many adjustment marks enhance this effect even further.

To eliminate this disadvantage, the invention calls for using an adjustment light with a bandwidth of at least 30 nm, and preferably at least 120 nm. This causes the light and dark stripes of the primary light to be replaced by rings of different color (Newton rings). There is an extremely small variation in overall intensity of the light reflected from a mark over the area of the mark itself.

DESCRIPTION OF THE DRAWINGS

Further details of the invention will be illustrated with the aid of the drawings. Here.

DETAILED DESCRIPTION OF THE PREFERRED EMBODIMENTS

Figure 1:
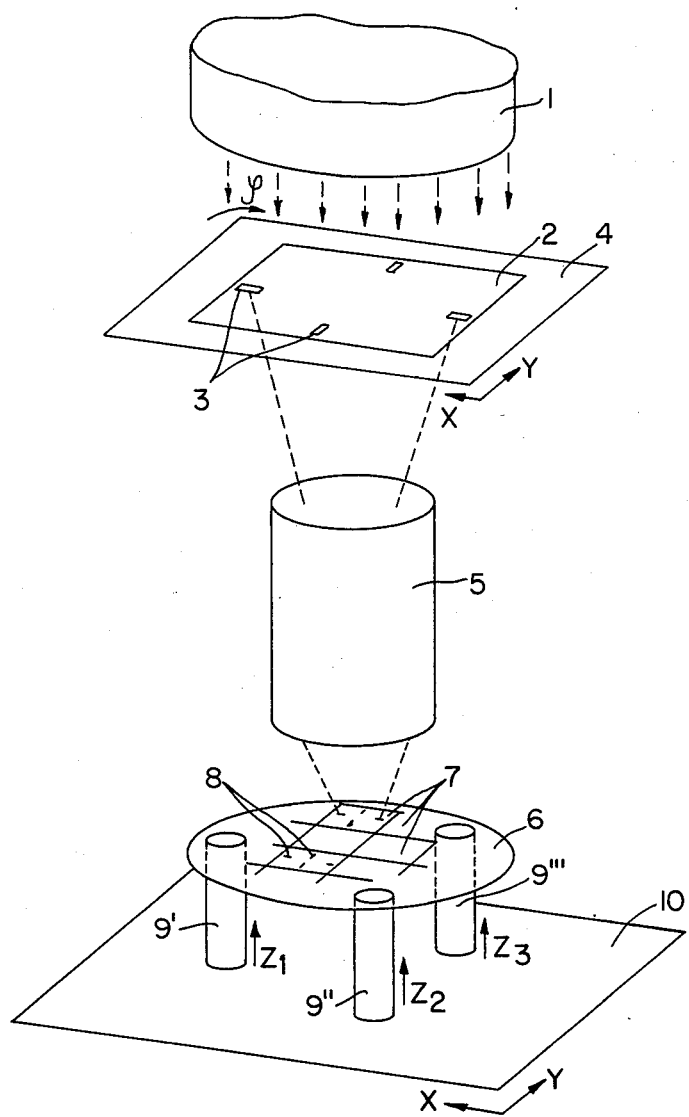
FIG. 1 shows an oblique view of the known arrangement of the essential elements of a projection copying device for the production of integrated circuits.

The essential components of a projection copying device for the production of integrated circuits are shown in FIG. 1. The unit consists essentially of an illumination device 1, a mask stage 4, a projection lens 5 and a coordinate table 10. The mask to be depicted 2 lies on mask stage 4 in the object plane of projection lens 5, while the semiconductor substrate is located in the picture plane on three shifting devices 9' to 9'''.

Coordinate table 10 is provided in a known fashion for stepwise shifting of substrate 6 in order to project the circuit pattern of mask 2 in succesive steps on preselected area 7 using the step-and-repeat procedure. In order to be able to carry out exact alignment between substrate 6 and mask 2 relative to projection lens system 5 prior to each projection, alignment pattern 3 is coordinated with the mask and adjustment marks 8 are coordinated with areas 7 on the substrate. Depending on the alignment errors in each case, for example, mask stage 4 can be shifted in the coordinates of object plane XY and $\theta$ and the substrate can be shifted along the optical axis of the system. In order to be able to ensure precise angular alignment of substrate 6 in the picture plane of projection lens 5, there are three shifting units 9', 9'' and 9''' which can be controlled separately.

Figure 2:
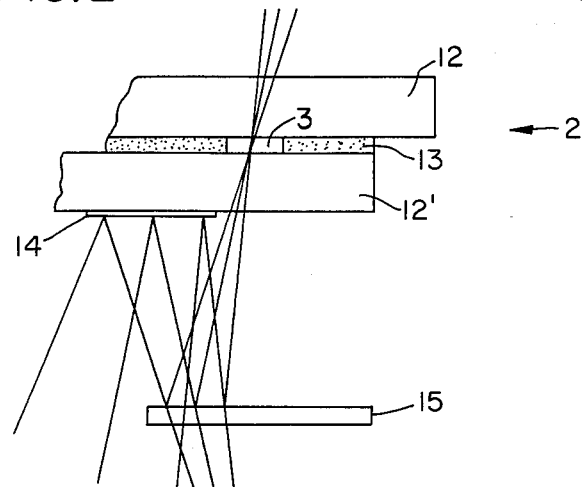
FIG. 2 shows a schematic section from FIG. 1 as well as the intensity profile of an alignment mark.

FIG. 2 shows how alignment errors are conventionally determined in such a device: mask 2 consists of two glasses 12 and 12', between which mask layer 13 is placed. The beams which come from illumination device 1 and are incident on an alignment mark 3 which is designed as a window with at least two parallel edges are reflected by a half-silvered mirror placed below mask 2 and are directed via a mirror 14, located on the bottom of glass 12', onto the area of corresponding adjustment mark 8 of substrate 6. The images of window 3 on the top of the substrate and adjustment mark 8 are projected back from projection lens 5 and are projected by mirror 14 through half-silvered mirror 15 onto an analysis device 21.

Figure 2A:
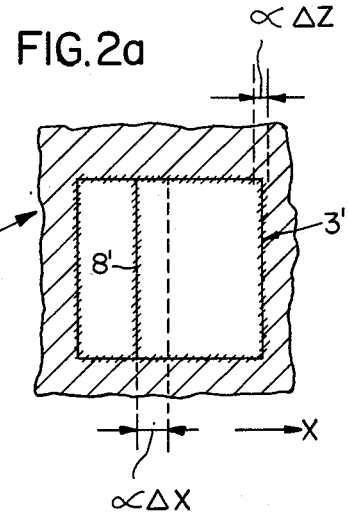
FIG. 2a shows a top view of the detection plane.
Figure 2A:
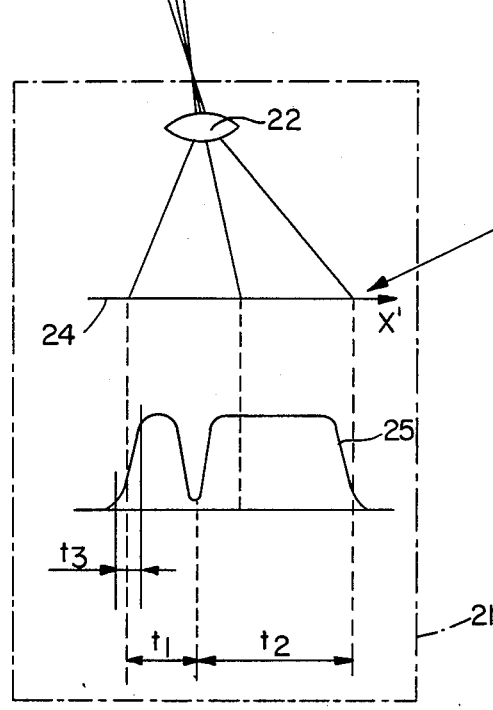

Lens arrangement 22 directs the bundle of rays coming from the adjustment mark area on the substrate onto a detection plane 24. In the present case, as FIG. 2a indicates, adjustment mark 8 is designed as a line element which runs parallel to two edges of window 3 of mask 2, and in the nominal position of substrate 6 this element runs normal to the direction in which the alignment error is to be determined. The intensity profiles of the image of window 3 and of the adjusment mark which are traced on detection plane 24 are shown as line 25. This intensity profile 25 is scanned in a direction which is normal to image 8' of line element 8 or image 3 of the corresponding edges of window 3. This can be done, for example, by having a rotating prism, not shown, throw the bundle of beams onto a photoelectric element, not shown, in front of which there is a gap which runs parallel to line element 8. By the same token, however, the photoelectric element can depict a large area of detection plane 24 while a gap is shifted back and forth in front of detection plane 4. Electrical signals corresponding to the intensity values which arise are generated. By measuring the time differences between the passage of certain threshold values, the alignment error is determined normally to the corresponding edges of window 3, as is the focusing error. If time T1 between the apearance of the first window edge and line element 8 is equal to time T2 between the appearance of the line element and the second window edge is equal (as in text), then the object and picture areas will be exactly aligned in their planes in the corresponding direction. The alignment of the object and picture areas in the object and picture planes of projection lens 5 along optical axis Z are determined by measuring the steepness of the image of the window edges. The rise time T3 in this case is, in turn, proportional to the focusing state.

Figure 3A:
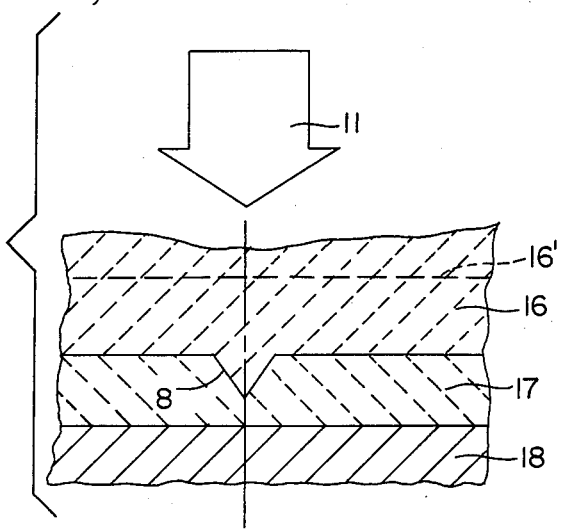
FIG. 3a shows a cross-section through the substrate in the area of an adjustment mark.
Figure 3B:
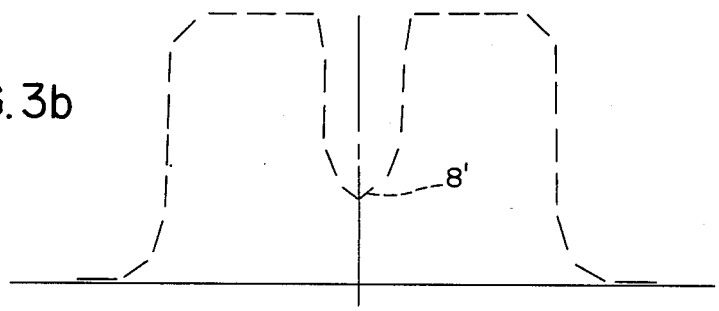
FIG. 3b shows the corresponding adjustment signal in idealized form.
Figure 3C:
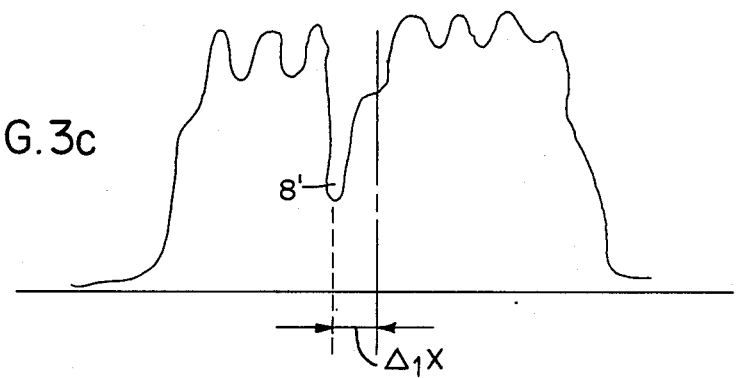
FIG. 3c shows the corresponding adjustment signal with narrowband illumination.
Figure 3D:
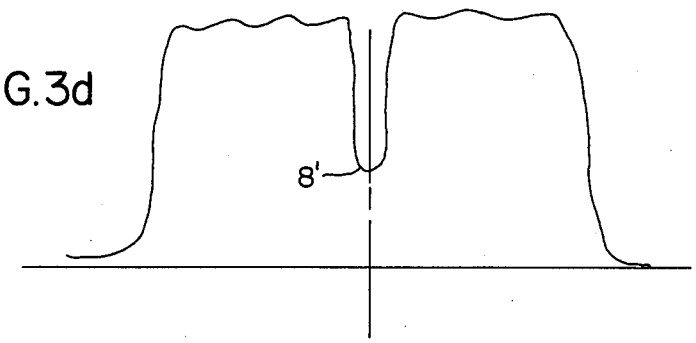
FIG. 3d shows the corresponding adjustment signal with wideband illumination.

In pracice it is found that, when an actual substrate, namely a wafer is illuminated in which a process layer 17 is built up on a base 18 and a photosensitive resist 16 is built up on this process layer (compare FIG. 3a), the corresponding signal will frequently not have the ideal form shown in FIG. 3b which would correspond to an ideal surface 16' of the substrate. If adjustment light 11 is more narrowband, for example, then illumination is done with a laser, then, as indicated by FIG. 3c, interference-induced intensity variations can occur in the observation area of an adjustment mark 8 which is limited by the edge of window 3. Although adjustment mark 8 is precisely centered, the impression can still arise that it is outside of the correct position by a distance $\Delta_1 X$. If, on the other hand, coordinate table 10 is moved until image 8' of adjustment mark 8 lies in the center of alignment pattern 3, in reality the substrate will also be laterally displaced by the same amount.

As mentioned, it is not possible to make allowance, by calculation, for this error which occasionally occurs due to the intensity variations in the observation area since the reflection capability of the substrate is a function of the wavelength and location on the substrate surface and this function is not known in detail since it assumes individual values for different substrates and different mark shapes. It is possible, however, to eliminate the effect of the wavelength dependency of this function to a large extent by working with relatively wideband adjustment light 11. In this case the preferred adjustment wavelength ranges lie between 480 and 600 nm and 520 and 600 nm. Justification for this lies in the fact that, on the one hand, we wish to be outside of the sensitivity area of the photosensitive resist on the one hand, and on the other, we with to be as close as possible to it so that the lens defects which are correct for the wavelength of the illumination light will remain as small as possible. A halogen lamp or a xenon high-pressure lamp can be used, for example, to generate the adjustment light.

The invention is based on the observation that even in cases where, from the very outset, an externally correct mark shape as shown in FIG. 3 is present and it is only when this mark shape is forced into being by the use of relatively wideband adjustment light, erratic errors arise in adjustment. The reason for this is, as mentioned, the fact that relatively wideband light is spectrally modulated in accordance with the reflection capability of the wafer, i.e., certain wavelength intervals from the primary adjustment light spectrum are attenuated to a greater extent, and others to a lesser extent. A shift in the center of the waveband occurs, which is important in two regards: first it is possible for adjustment marks 8 of two different wafers to shift the center of the waveband in different ways at the same point, for example, on the optical axis. If the reflected light is at one instant more green and then more yellow, the plane of the optimum focusing will lie at very different levels. The adjustment of the X-Y table at a Z position corresponding to a signal which previously delivered good picture quality in blue illumination light will suddenly lead to poorly focused pictures. Shifting of the color center of the reflected light compared to the input light occurs in particular when the observed adjustment marks are located at different points in the picture field. The reason for this is, on the one hand, the fact that the reflectivity function exhibits a systematic dependency on the distance from the center of the picture and, on the other hand, the fact that there are slight variations in the thickness of process layer 17. The distance from a mark which is away from the axis will be judged differently depending on the color of the reflected light. As in the case of FIG. 3c, this phenomenon, known as color magnification defect, leads to misjudgement of the lateral position of the substrate, although for different reasons.

In order to eliminate the above-mentioned problems, the invention carries out a type of achromatization, which is known per se, within the adjustment light band.

Figure 4:
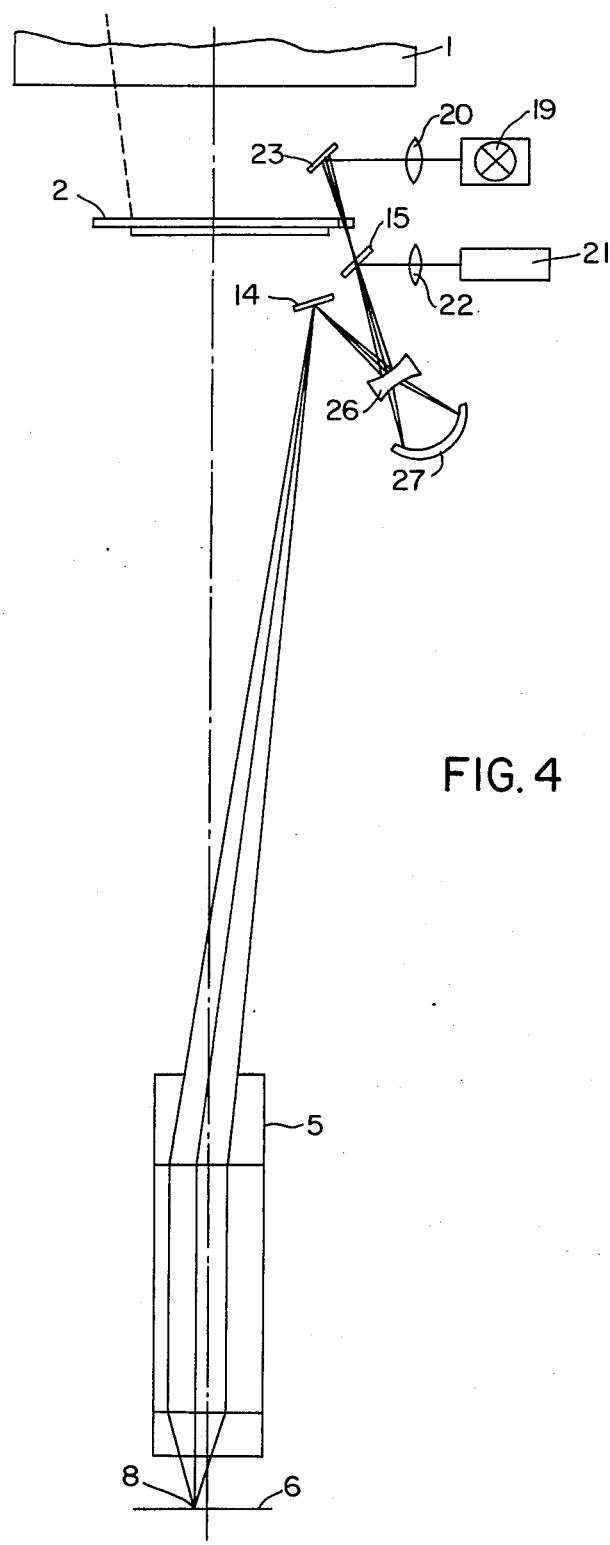
FIG. 4 shows a practical example of the invention in a schematic side view.

With presently available resources, this type of achromatization cannot be ensured over the entire picture field, but it is also not necessary. As FIG. 4 shows, it is sufficient simply to build an achromatization element into the path of the beam of the adjustment light. This element could consist in conventional fashion of a combination of a convergent (convex) lens and a concave lens. A particularly elegant solution is obtained, however, by using a combination of a concave lens 26 and a concave mirror 27. Compared to the known arrangement as shown in FIG. 2, no essential changes of the beam path are necessary; the adjustment light, which comes from a light source 19, is projected via a lens system 20 and a mirror 23 through alignment mark 3 in mask 2 and passes via the achromitazation device, which consists of concave lens 26 and concave mirror 27, and mirror 14 through the achromatization device and from obliquely set half-silvered mirror 15 to analysis unit 21, in front of which a lens arrangement 22 is placed.

It is particularly advantageous for it to be possible to select the bandwidth of the adjustment light generated by adjustment light source 19, for example, by having a rotary prism or rotary filter, filter out sub-areas of the band. In this way it is possible to choose the bandwidth in accordance with the practical requirements which differ depending on whether lateral alignment or focusing is to be achieved and depending on the types of marks used in the different stages of processing a wafer. If e.g. the adjustment mark 8 consists of a narrow antireflexive instead of the groove shown in FIG. 3 the reflexivity contrast depends on the bandwidth of the adjustment light. In order to achieve a satisfactory signal it may be necessary in this case to perform only the focusing operation with a relatively broad band of, say, 30 nm bandwidth. The lateral alignment will then be performed with a narrow band of a few nm which is possible because an antireflexive mark does not show the fringing effects discussed in connection with FIG. 3. It is particularly advantageous if different sub-areas of a relatively wide band adjustment light can be selected for the lateral alignment. In this case the actual alignment is performed with a type of light which was found to provide the best contrast between adjustment mark 8 and its surrounding field.

What is claimed is:

1. An improved device for projection-copying of a mask onto a workpiece, in particular a semiconductor substrate for the production of integrated circuits, in which case the pattern of the mask is projected via a projection lens onto a photosensitive layer of the workpiece in order to align the mask and workpiece relative to one another after alignment patterns of the mask and adjustment areas on the workpiece have been projected onto each other by means of an adjustment light through the projection lens, the improvement comprising an auxiliary optical system positioned out of symmetry with the projection lens to receive adjustment light coming only from a sub-area of the workpiece which includes at least one adjustment area, said auxiliary lens system including a device for correcting chromatic aberration caused by said adjustment light.

2. Device in accordance with claim 1, wherein said adjustment light has a bandwidth of at least 1 nm.

3. Device in accordance with claim 1 wherein at least one adjustment area lies outside of the optical axis and the correction of the chromatic aberration is made for longitudinal color defect and color magnification error.

4. Device in accordance with claim 1, wherein a portion of said adjustment light which lies inside the corrected band can be filtered out.

5. Device in accordance with claim 2 wherein a portion of said adjustment light which lies inside the corrected band can be filtered out.

6. Device in accordance with claim 4 wherein to generate a reflexivity contrast, various sub-areas can be filtered out with the aid of a rotary prism.

7. Device in accordance with claim 5 wherein to generate a reflexivity contrast, various sub-areas can be filtered out with the aid of a rotary prism.

8. Device in accordance with claim 1 wherein the device for correcting chromatic aberration consists of a combination of a concave, divergent lens and a concave mirror.

9. Device in accordance with claim 1 wherein the wavelength range of said adjustment light lies outside the range of spectral sensitivity of the photosensitive resist.

10. Device in accordance with claim 1 wherein the wavelength range of said adjustment light extends from 480 to 600 m.

11. Device in accordance with claim 10 wherein the wavelength range of said adjustment light extends from 520 to 600 m.

12. Device in accordance with claim 1 wherein said adjustment light comprises the filtered light of a halogen lamp.

13. Device in accordance with claim 1 wherein said adjustment light comprises the filtered light of a xenon high-pressure light.

14. Device in accordance with claim 1 wherein said adjustment light comprises "white" light.

15. Device in accordance with claim 4 wherein to generate a reflexivity contrast, various sub-areas can be filtered out with the aid of a rotary filter.

16. Device in accordance with claim 5 wherein to generate a reflexivity contrast, various sub-areas can be filtered out with the aid of a rotary filter.

* * * * *